United States Patent [19]

Kato et al.

[11] Patent Number: 4,837,123

[45] Date of Patent: Jun. 6, 1989

[54] MASK STRUCTURE FOR LITHOGRAPHY, METHOD OF PREPARATION THEREOF AND LITHOGRAPHIC METHOD

[75] Inventors: Hideo Kato; Masaaki Matsushima, both of Yokohama; Keiko Matsuda, Machida; Hirofumi Shibata, Yokohama, all of Japan

[73] Assignee: Canon Kabushiki Kaisha, Tokyo, Japan

[21] Appl. No.: 170,688

[22] Filed: Mar. 14, 1988

Related U.S. Application Data

[63] Continuation of Ser. No. 815,037, Dec. 31, 1985, abandoned.

[30] Foreign Application Priority Data

| Jan. 7, 1985 | [JP] | Japan | 60-000664 |
| Jan. 8, 1985 | [JP] | Japan | 60-001772 |
| Jan. 9, 1985 | [JP] | Japan | 60-001890 |
| Apr. 25, 1985 | [JP] | Japan | 60-90199 |
| Apr. 26, 1985 | [JP] | Japan | 60-90125 |

[51] Int. Cl.⁴ ............... G03C 5/00; G03F 1/00
[52] U.S. Cl. ............... 430/269; 430/5; 430/321; 430/322; 428/698; 428/702
[58] Field of Search ............... 430/5, 321, 269, 322; 428/698, 702; 378/34, 35

[56] References Cited

U.S. PATENT DOCUMENTS

| 4,363,846 | 12/1982 | Kaneki | 428/203 |
| 4,374,912 | 2/1983 | Kaneki et al. | 430/5 |
| 4,440,841 | 4/1984 | Tabuchi | 430/5 |
| 4,451,544 | 5/1984 | Kawabucki | 430/5 |
| 4,539,278 | 9/1985 | Williams et al. | 430/5 |
| 4,563,407 | 1/1986 | Matsui et al. | 430/5 |

FOREIGN PATENT DOCUMENTS 0073136 3/1983 European Pat. Off. ............... 430/5

Primary Examiner—José G. Dees
Attorney, Agent, or Firm—Fitzpatrick, Cella, Harper & Scinto

[57] ABSTRACT

A mask structure for lithography has a mask material holding thin film and a holding substrate for holding the peripheral portion of said mask material holding thin film, said mask material holding thin film comprising a film comprising aluminum, nitrogen and oxygen.

36 Claims, 9 Drawing Sheets

Fig./ (a)
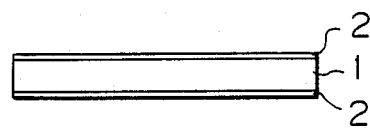
Fig./ (e)
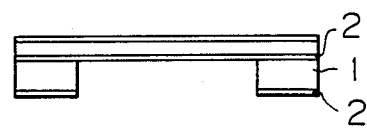
Fig./ (b)
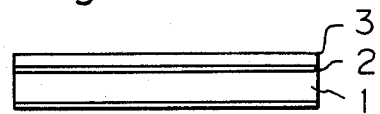
Fig./ (f)
Fig./ (c)
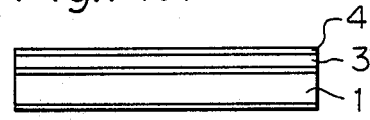
Fig./ (g)
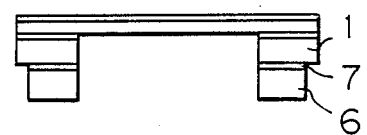
Fig./ (d)
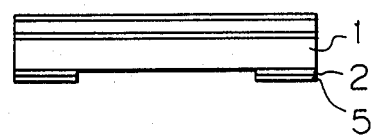
Fig./ (h)
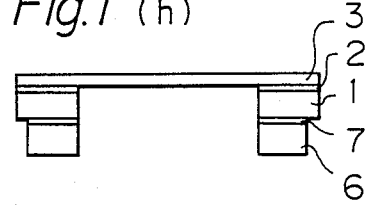

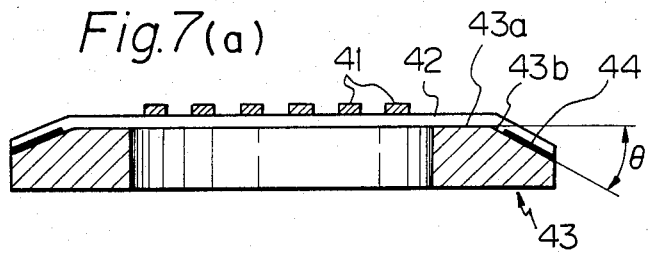
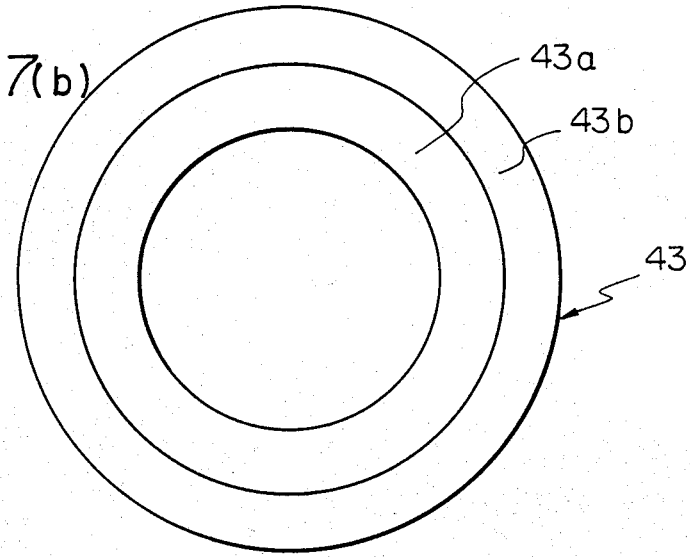
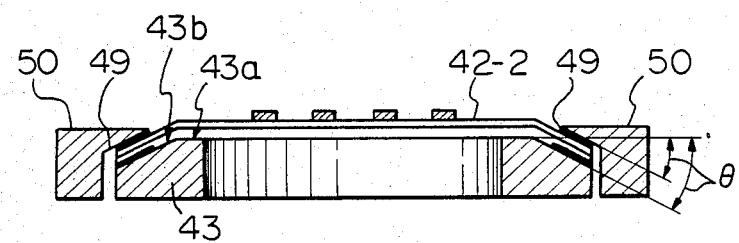

MASK STRUCTURE FOR LITHOGRAPHY, METHOD OF PREPARATION THEREOF AND LITHOGRAPHIC METHOD

This application is a continuation of application Ser. No. 815,037, filed 12/31/1985, now abandoned.

BACKGROUND OF THE INVENTION

1. Field of the Invention

This invention relates to a mask structure for lithography, a method for preparation thereof and a lithographic method by use of the mask structure for lithography, particularly to a mask structure for lithography suitable for projecting a mask pattern on a wafer coated with a photosensitive agent in the steps for production of semiconductors, a method for preparation thereof and a lithographic method by use of the mask structure for lithography.

2. Description of the Prior Art

X-ray lithography has a number of characteristics more excellent than lithography by visible light or UV-rays formerly practiced on the basis of a rectilinear propagation characteristic, incoherence, low diffraction characteristic, etc., and is attracting attention as a powerful means for submicron lithography.

While X-ray lithography has a number of superior points as compared with lithography by visible light or UV-rays, it involves the drawbacks such as insufficient power of the X-ray source, low sensitivity of resist, difficulty in alignment and difficulty in choice of mask material and working method, whereby productivity is low and the cost is high to cause difficulty in practical application.

Among them, referring now to the mask to be used for X-rays lithography, in lithography by visible light or UV-ray, glass plates and quartz plates have been utilized as the mask material holding member (namely light-transmitting member). However, in X-ray lithography, the wavelength of the ray which can be utilized is 1 to 200 Å. The glass plates or quartz plates hitherto used absorbs greatly the ray in this X-ray wavelength region and also the thickness must be made as thick as 1 to 2 mm, whereby X-rays cannot sufficiently be transmitted, and these are unsuitable as the material for the mask material holding member to be used for X-ray lithography.

X-ray transmittance generally depends on the density of a material, and therefore inorganic materials or organic materials with low density are going to be investigated as the material for the mask material holding member to be used for X-ray lithography. Such materials may include, for example, inorganic materials such as simple substances of beryllium (Be), titanium (Ti), silicon (Si) and boron (B), and compounds thereof, or organic compounds such as polyimide, polyamide, polyester, poly-p-xylylene, etc.

For practically using these substances as the material of the mask material holding member to be used for X-ray lithography, they are required to be made into thin films for increasing the amount of X-rays transmitted as much as possible, to a thickness of some microns or less in the case of an inorganic material and some ten microns or less in the case of an organic material. For this reason, in forming, for example, a mask material holding member comprising a thin film of an inorganic material or a composite film thereof, there is proposed the method in which a thin film of $Si_3N_4$, $SiO_2$, BN, SiC, etc. is formed on a silicon wafer, which is excellent in flatness, by vapor deposition, etc. and thereafter the silicon wafer is removed by etching.

On the other hand, as the mask material (namely the X-ray absorbing material) to be used for X-ray lithography held on the mask material holding member as described above, it is preferred to use a thin film of a material having high density such as gold, platinum, tungsten, tantalum, copper, nickel, etc., preferably a thin film with a thickness of 0.5 to 1μ. Such a mask can be prepared by, for example, forming a thin film of the above high density material uniformly on the above mask material holding member, then applying a resist thereon, effecting a desired pattern drawing on the resist with an electron beam, light, etc. and thereafter forming to a desired pattern by means of etching, etc.

And, in the X-ray lithography of the prior art as described above, the X-ray transmittance through the mask material holding member was low and hence the mask material holding member is required to be made considerably thin in order to obtain sufficient amount of X-rays transmitted, whereby there is involved the problem that it can be prepared with difficulty.

SUMMARY OF THE INVENTION

It is, therefore, an object of the present invention to provide a mask material holding thin film having good X-ray transmittance, thereby improving the practice of lithography in view of the prior art as described above.

According to one aspect of the present invention, there is provided a mask structure for lithography having a mask material holding thin film and a holding substrate for holding the peripheral portion of the mask material holding thin film, the mask material holding thin film comprising a film comprising aluminum, nitrogen and oxygen, and a lithographic method by use of the mask structure for lithography.

According to another aspect of the present invention, there is provided a process for preparing a mask structure for lithography comprising the steps of:

forming a mask material holding thin film comprising a film comprising aluminum, nitrogen and oxygen on a substrate;

adhering a ring-shaped holding substrate to said mask material holding thin film; and removing said substrate from said mask material holding thin film.

BRIEF DESCRIPTION OF THE DRAWINGS

FIGS. 1(a)–(h), FIGS. 2(a)–(h), FIGS. 3(a)–(h), FIGS. 4(a)–(h) and FIG. 5(a)–(h) are schematic central longitudinal sectional views each showing the preparation steps of an example of the mask structure for lithography according to the present invention.

FIG. 7(a) is a schematic central longitudinal sectional view showing an example of the mask structure for lithography according to the present invention, and FIG. 7(b) is a schematic plan view of the ring frame of the mask structure for lithography.

FIG. 9 is a schematic central longitudinal sectional view showing an example of the mask structure for lithography according to the present invention.

DETAILED DESCRIPTION OF THE PREFERRED EMBODIMENTS

Figure 2:
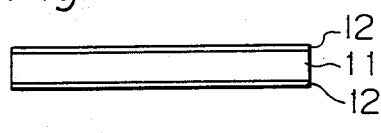
Figure 2:
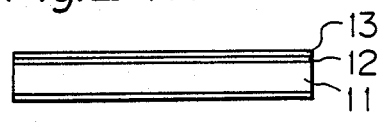
Figure 2:
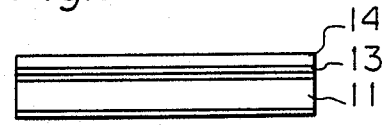
Figure 2:
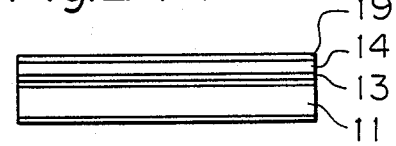
Figure 2:
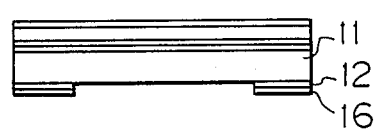
Figure 2:
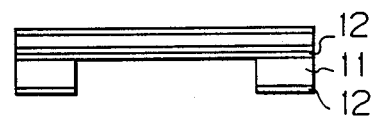
Figure 2:
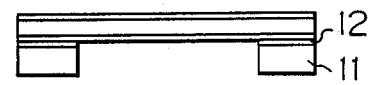
Figure 2:
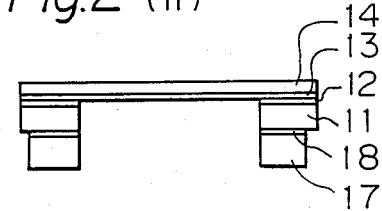

For accomplishing the above objects, in the present invention, a film containing aluminum, nitrogen and oxygen (hereinafter referred to as an Al-N-O system film) is used as the constituent element of the mask material holding thin film of the mask, structure for lithography. The substance containing aluminum, nitrogen and oxygen (hereinafter referred to as Al-N-O system substance) has specific features of high X-ray transmittance and visible light transmittance (about 0.1 of optical density through 1 μm thickness), low coefficient of thermal expansion ($3-4 \times 10^{-6}/°C.$), high coefficient of thermal conductivity and good film forming property, and therefore it is good as the mask material holding thin film of the mask structure for lithography.

In the present invention, the term film or substance containing aluminum, nitrogen and oxygen refers to a film or substance containing aluminum and nitrogen as main components and oxygen as an additive, or a film or substance containing aluminum, nitrogen and oxygen as main components.

The mask material holding thin film may be either a single layer film of Al-N-O system film or a laminated layer film of a layer of Al-N-O system substance and a layer of an organic material and/or a layer of an inorganic material other than Al-N-O system film.

In the case of using a laminated film of an Al-N-O system film and a layer of an organic material as the mask material holding thin film of the mask structure for lithography, the mask material holding thin film can be made to have characteristics possessed by the organic material in addition to the characteristics of the Al-N-O system film as described above. More specifically, the mask material holding thin film, in addition to the effect possessed by the mask material holding thin film comprising a single layer film of Al-N-O system film, has the effects of greater strength and substantial absence of stress.

As the organic material constituting the above laminated film in the present invention, it is possible to use those having at least a film forming property and X-ray transmitting ability. Such organic materials may be exemplified by polyimide, polyamide, polyester, poly-p-xylylene (trade name: Parylene, produced by Union Carbide Co.). Among them, polyimide is particularly preferable for its overall performances such as heat resistance, impact resistance, visible light transmitting ability.

In the case of using a laminate film of an Al-N-O system film and a layer of an inorganic material different from Al-N-O system material as the mask material holding thin film, a mask material holding thin film having the characteristics of the inorganic material in addition to the characteristics of the Al-N-O system film as described above can be obtained. That is, such a mask material holding thin film has also excellent light transmittance and thermal conductivity as well as relatively great strength and chemical resistance. Also, when a layer of an organic material is further laminated, the specific features such as greater strength and substantial absence of stress are added.

In the present invention, as the inorganic material constituting the above laminated film, there may be employed those having at least a film forming property and X-ray transmitting ability. Such materials may include, for example, aluminum nitride, boron nitride, silicon nitride, silicon oxide, silicon carbide, titanium, etc. Especially aluminum nitride has specific features of high X-ray transmittance and visible light transmittance, low coefficient of thermal expansion, high coefficient of thermal conductivity and good film forming property, and therefore it is preferred as the inorganic material.

When boron nitride which is excellent in chemical resistance is laminated as the protective film of Al-N-O system film, there can be obtained a laminated film which is very excellent in film characteristics, such as X-ray transmitting ability, light transmitting ability, thermal conductivity, electroconductivity, chemical resistance, etc.

The laminated film constituting the above mask material holding thin film may consist of two layers of an Al-N-O system film and a layer of an organic material, or alternatively three or more layers as a whole having two or more layers of at least one of an Al-N-O system film and an organic material layer.

The laminated film constituting the above mask material holding thin film may consist of two layers of an Al-N-O system film and a layer of an inorganic material different from Al-N-O system material, or alternatively three or more layers as a whole having two or more layers of at least one of an Al-N-O system film and a layer of an inorganic material different from Al-N-O system material.

Further, the laminated film constituting the above mask material holding thin film may also consist of three or more layers of at least one of an Al-N-O system film, at least one of a layer of an inorganic material different from Al-N-O system material and at least one of a layer of an organic material.

The thickness of the mask material holding thin film according to the present invention is not particularly limited, but it can be made to have a suitable thickness, for example, advantageously about 2 to 20 μm.

The ring-shaped holding substrate (ring frame) in the mask structure for lithography of the present invention comprises, for example, silicon, glass, quartz, phosphor bronze, brass, nickel, stainless steel, etc. As the mask material, there may be employed a thin film with a thickness of about 0.5 to 1 μm such as of gold, platinum, nickel, palladium, rhodium, indium, tungsten, tantalum, copper, etc.

The mask structure for lithography as mentioned in the present invention is inclusive of all the three kinds of:

(1) a structure having a mask material holding thin film and a ring-shaped holding substrate for holding the peripheral portion of the mask material holding thin film;

(2) a structure having further a mask material imparted in a thin film on one surface of the above mask material holding thin film; and (3) a structure in which the above mask material is patternized.

The mask structure for lithography according to the present invention can be prepared according to the preparation method of the prior art by, for example, forming a mask material holding thin film comprising an Al-N-O system film as a constituent element on a silicon wafer, forming a patternized mask material thereof and then etching its central portion from the backside of the silicon wafer, whereby the desired objects can sufficiently be accomplished. However, the present invention further has an object to provide a process for preparing a mask structure for lithography the preparation steps of which are simple, rapid and good in yield, in addition to the above objects.

The process for preparing a mask structure for lithography for accomplishing such an object comprises the steps of:

forming a mask material holding thin film comprising an Al-N-O system film;

adhering a ring-shaped holding substrate to said mask material holding thin film; and removing said substrate from said mask material holding thin film.

The mask structure for lithography according to the present invention can sufficiently accomplish its desired objects by taking a form in which the mask material holding thin film having an Al-N-O system film as a constituent element is adhered on the uppermost flat end plane of the ring-shaped holding substrate, but the present invention further has an object to provide a mask structure for lithography further improved in flatness of the mask material holding thin film in addition to the above objects.

The mask structure for lithography of the present invention for accomplishing such an object has a mask material holding thin film comprising an Al-N-O system film and a ring-shaped holding substrate for holding the peripheral portion of the mask material holding thin film, the mask material holding thin film being adhered to the ring-shaped holding substrate at a position lower than the uppermost flat end plane.

The present invention is described in more detail by referring to the drawings.

EXAMPLE 1

FIGS. 1(a)-(h) are schematic central sectional views showing the steps for preparation of an example of the mask structure for lithography according to the present invention.

As shown in FIG. 1(a), silicon oxide layers 2 with a thickness of 1 $\mu$m were formed on both surfaces of a circular silicon wafer 1 with a diameter of 10 cm.

Next, as shown in FIG. 1(b), by means of a hot electron impact type ion plating device, an Al-N-O system film 3 with a thickness of 3 $\mu$m was formed at a film forming speed of about 10 Å/sec on one side of the silicon oxide layers according to the ion plating method by use of an Al target, a gas atmosphere having a volume ratio of argon (Ar):nitrogen ($N_2$):oxygen ($O_2$)=1:3:0.1, a discharging power of 40 W, an acceleration voltage of 600 V, a gas pressure of $2 \times 10^{-4}$ Torr and a substrate temperature of 80° C.

Next, as shown in FIG. 1(c), a tar type paint layer 4 for protection was formed on the Al-N-O system film 3.

Next, as shown in FIG. 1(d), the circular central portion of the silicon oxide film 2 exposed with a diameter of 7.5 cm was removed with the use of a mixture of ammonium fluoride and hydrofluoric acid. In carrying out this treatment, for the purpose of having the silicon oxide film 2 remained in shape of a ring, a layer 5 of Apiezone wax (produced by Shell Chemical Co.) for protection was formed at that portion, and the wax layer 5 was removed after removal of the central portion of the silicon oxide layer 2.

Next, as shown in FIG. 1(e), electrolytic etching (current density 0.2 A/dm$^2$) was effected in an aqueous 3% hydrofluoric acid solution to remove the circular central portion of the silicon wafer 1 exposed with a diameter of 7.5 cm.

Next, as shown in FIG. 1(f), with the use of a mixture of ammonium fluoride and hydrofluoric acid, the silicon oxide film 2 at the exposed portion was removed.

Next, as shown in FIG. 1(g), onto one surface of a ring frame 6 (made of Pyrex, inner diameter 7.5 cm, outer diameter 9 cm, thickness 5 mm), an epoxy type adhesive 7 was coated, and the above silicon wafer 1 was adhered to the adhesive-coated surface on the side opposite to that on which the Al-N-O system film 3 was formed.

Next, as shown in FIG. 1(h), the tar type paint layer 4 was removed with acetone.

Thus, a mask structure for lithography having an Al-N-O system film 3 under the state fixed with a ring frame 6 and a silicon wafer 1 was obtained.

EXAMPLE 2

In the steps of Example 1, after formation of the Al-N-O system film, a layer of a photoresist RD-200N (produced by Hitachi Kasei Co.) was formed to a thickness of 1.2 $\mu$m by spin coating.

Next, after the resist was printed with the use of a quartz-chromium mask by far UV-rays, a prescribed treatment was effected to obtain a resist pattern which is nega type relative to the mask.

Next, by means of an electron beam vapor deposition device, tantalum (Ta) was vapor deposited to a 0.5 $\mu$m thickness.

Next, the resist was removed with a remover, and a Ta film pattern was obtained according to the lift-off method.

Next, a tar type paint layer was formed on the Al-N-O system film similarly as in Example 1.

Following subsequently the same steps of Example 1, a mask structure for lithography was obtained which has a mask material holding thin film comprising an Al-N-O system film and a Ta film pattern under the state fixed with a ring frame and a silicon wafer.

EXAMPLE 3

In Example 1, except for forming the Al-N-O system film according to the reactive sputtering method by use of an aluminum nitride (AlN) target, a gas mixture of argon (Ar):nitrogen ($N_2$):oxygen ($O_2$) = 1:1:0.5, a gas pressure of $5 \times 10^{-3}$ Torr, a discharging power of 150 W and a film forming speed of 15 Å/min., the same steps of Example 1 were repeated to obtain a mask structure for lithography.

EXAMPLE 4

In Example 1, except for forming the Al-N-O system film according to the reactive sputtering method by use of an aluminum oxide nitride (7Al$_3$O$_7$:3AlN) target, a gas mixture of argon (Ar):nitrogen ($N_2$)=1:1, a gas pressure of $5 \times 10^{-3}$ Torr, a discharging power of 200 W and a film forming speed of 10 Å/min., the same steps of Example 1 were repeated to obtain a mask structure for lithography.

EXAMPLE 5

FIGS. 2(a)-(h) are schematic central sectional views showing the steps for preparation of an example of the mask structure for lithography according to the present invention.

As shown in FIG. 2(a), silicon oxide layers 12 with a thickness of 1 μm were formed on both surfaces of a circular silicon wafer 11 with a diameter of 10 cm.

Next, as shown in FIG. 2(b), after PIQ liquid (polyimide precursor, produced by Hitachi Kasei Co.) was applied by spin coating on the silicon oxide film 12 on one side of the silicon wafer 11, the coating was cured at 50° to 350° C. for 4 hours to form a polyimide film 13 with a thickness of 2 μm.

Next, as shown in FIG. 2(c), by means of a hot electron impact type ion plating device, an Al-N-O system film 14 with a thickness of 2 μm was formed at a film forming speed of about 10 Å/sec on the polyimide film 13 by use of an aluminum (Al) target, a gas atmosphere having a volume ratio of argon (Ar):nitrogen ($N_2$):oxygen ($O_2$)=1:3:0.1, a discharging power of 40 W, an acceleration voltage of 600 V, a gas pressure of $3 \times 10^{-4}$ Torr and a substrate temperature of 80° C.

Next, as shown in FIG. 2(d), a tar type paint layer 19 for protection was formed on the Al-N-O system film 14.

Next, as shown in FIG. 2(e), the circular central portion of the silicon oxide film 12 exposed with a diameter of 7.5 cm was removed with the use of a mixture of ammonium fluoride and hydrofluoric acid. In carrying out this treatment, for the purpose of having the silicon oxide film 12 remained in shape of a ring, a layer 16 of Apiezone wax (produced by Shell Chemical Co.) for protection was formed at that portion, and the wax layer 16 was removed after removal of the central portion of the silicon oxide layer.

Next, as shown in FIG. 2(f), electrolytic etching (current density 0.2 A/dm²) was effected in an aqueous 3% hydrofluoric acid solution to remove the circular central portion of the silicon wafer 11 exposed with a diameter of 7.5 cm.

Next, as shown in FIG. 2(g), with the use of a mixture of ammonium fluoride and hydrofluoric acid, the silicon oxide film 12 at the exposed portion was removed.

Next, as shown in FIG. 2(h), onto one surface of a ring frame 17 (made of Pyrex, inner diameter 7.5 cm, outer diameter 9 cm, thickness 5 mm), an epoxy type adhesive 18 was coated, and the above silicon wafer 11 was adhered to the adhesive-coated surface on the side opposite to that on which the polyimide film 13 and the Al-N-O system film 14 were formed, followed by removal of the tar type paint layer 19.

Thus, a mask structure for lithography having a laminate of a polyimide film 13 and an Al-N-O system film 14 under the state fixed with a ring frame 17 and a silicon wafer 11 was obtained.

The mask material holding thin film having a constitution of polyimide film: Al-N-O system film obtained in this Example was particularly good in strength.

EXAMPLE 6

Except for forming a polyester film with a thickness of 2 μm according to the vapor deposition method on the silicon oxide film 12 on one side of the silicon wafer 11 in place of the polyimide film 13, the same steps of Example 5 were repeated.

Thus, a mask structure for lithography having a laminate of a polyester film and an Al-N-O system film under the state fixed with a ring frame and a silicon wafer was obtained.

The mask material holding thin film having a constitution of polyester film: Al-N-O system film obtained in this Example was particularly good in strength.

EXAMPLE 7

Except for forming a poly-p-xylylene film (trade name: Parylene, produced by Union Carbide Co.) with a thickness of 2 μm according to the vapor deposition method on the silicon oxide film 12 on one side of the silicon wafer 11 in place of the polyimide film 13, the same steps of Example 5 were repeated.

Thus, a mask structure for lithography having a laminate of a poly-p-xylylene film and an Al-N-O system film under the state fixed with a ring frame and a silicon wafer was obtained.

The mask material holding thin film having a constitution of poly-p-xylylene film : Al-N-O system film obtained in this Example was particularly good in strength.

EXAMPLE 8

In the steps of Example 5, after formation of the polyimide film 13 and the Al-N-O system film 14, a layer of a photoresist OMS (chloromethylated polystyrene, produced by Toyo Soda Co.) on the Al-N-O system film 14.

Next, after picture drawing of a mask pattern was conducted by means of an electron beam picture drawing device, a prescribed treatment was effected to obtain a resist pattern.

Next, nickel (Ni) was vapor deposited to a thickness of 0.5 μm on the above resist pattern by means of an electron beam vapor deposition machine.

Next, the resist was removed with a remover to obtain a nickel film pattern.

Next, a tar type paint layer for protective purpose was formed on the Al-N-O system film having a nickel film pattern.

Following subsequently the same steps as in Example 5, a mask structure for lithography was obtained which has a mask material holding thin film comprising a laminate of a polyimide film and an Al-N-O system film and a nickel film pattern under the state fixed with a ring frame and a silicon wafer.

The mask material holding thin film having a constitution of polyimide film: Al-N-O system film obtained in this Example was particularly good in strength.

EXAMPLE 9

In the steps of Example 6, after formation of the polyester film and the Al-N-O system film, a layer of a photoresist CMS was formed on the Al-N-O system film.

Following subsequently the same steps as in Example 8, a mask structure for lithography was obtained which has a mask material holding thin film comprising a laminate of a polyester film and an Al-N-O system film and a nickel film pattern under the state fixed with a ring frame and a silicon wafer.

The mask material holding thin film having a constitution of polyester film: Al-N-O system film obtained in this Example was particularly good in strength.

EXAMPLE 10

In the steps of Example 7, after formation of the poly-p-xylylene film and the Al-N-O system film, a layer of a photoresist CMS was formed on the Al-N-O system film.

Following subsequently the same steps as in Example 8, a mask structure for lithography was obtained which has a mask material holding thin film comprising a laminate of a poly-p-xylylene film and an Al-N-O system film and a nickel film pattern under the state fixed with a ring frame and a silicon wafer.

The mask material holding thin film having a constitution of poly-p-xylylene film: Al-N-O system film obtained in this Example was particularly good in strength.

EXAMPLE 11

FIGS. 3(a)-(h) are schematic central sectional views showing the steps for preparation of an example of the mask structure for lithography according to the present invention.

Figure 3A:
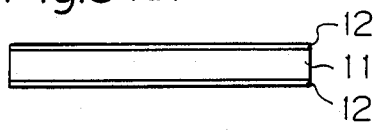

As shown in FIG. 3(a), silicon oxide layers 12 with a thickness of 1 μm were formed on both surfaces of a circular silicon wafer 11 with a diameter of 10 cm.

Figure 3E:
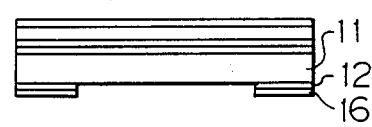
Figure 3B:
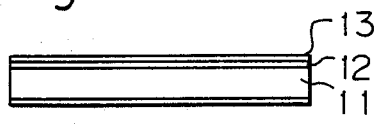

Next, as shown in FIG. 3(b), after PIQ liquid (polyimide precursor) was applied by spin coating on the silicon oxide film 12 on one side of the silicon wafer 11, the coating was cured at 50° to 350° C. for 4 hours to form a polyimide film 13 with a thickness of 2 μm.

Figure 3F:
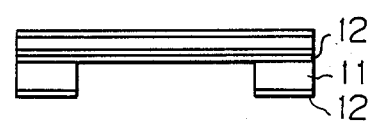
Figure 3C:
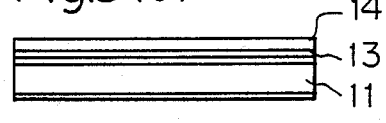

Next, as shown in FIG. 3(c), according to the reactive sputtering method, an Al-N-O system film 14 with a thickness of 1 μm was formed at a film forming speed of about 15 Å/min on the polyimide film 13 by use of an aluminum nitride (AlN) target, a gas atmosphere having a volume ratio of argon (Ar):nitrogen ($N_2$):oxygen ($O_2$)=1:1:0.5, a gas pressure of $5 \times 10^{-3}$ Torr, a discharging power of 50 W, and a substrate temperature of 80° C.

Figure 3G:
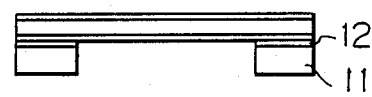
Figure 3D:
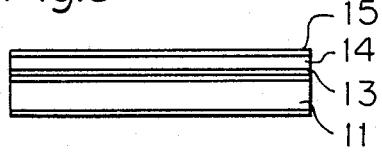

Next, as shown in FIG. 3(d), a polyimide film 15 with a thickness of 2 μm was formed similarly as described above on the Al-N-O system film 14.

Next, as shown in FIG. 3(e), the circular central portion of the silicon oxide film 12 exposed with a diameter of 7.5 cm was removed with the use of a mixture of ammonium fluoride and hydrofluoric acid. In carrying out this treatment, for the purpose of having the silicon oxide film 12 remained in shape of a ring, a layer 16 of Apiezone wax (produced by Shell Chemical Co.) for protection was formed at that portion, and the wax layer 16 was removed after removal of the central portion of the silicon oxide layer 12.

Next, as shown in FIG. 3(f), electrolytic etching (current density 0.2 A/$dm^2$) was effected in an aqueous 3% hydrofluoric acid solution to remove the circular central portion of the silicon wafer 11 exposed with a diameter of 7.5 cm.

Next, as shown in FIG. 3(g), with the use of a mixture of ammonium fluoride and hydrofluoric acid, the silicon oxide film 12 at the exposed portion was removed.

Figure 3H:
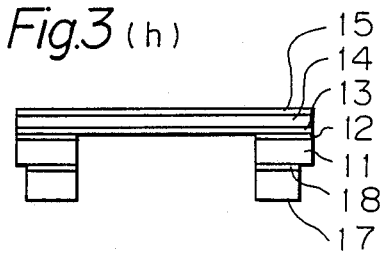

Next, as shown in FIG. 3(h), onto one surface of a ring frame 17 (made of Pyrex, inner diameter 7.5 cm, outer diameter 9 cm, thickness 5 mm), an epoxy type adhesive 18 was coated, and the above silicon wafer 11 was adhered to the adhesive-coated surface on the side opposite to that on which the polyimide films 13, 15 and the Al-N-O system film 14 were formed.

Thus, a mask structure for lithography having a laminate of polyimide films 13, 15 and an Al-N-O system film 14 under the state fixed with a ring frame 17 and a silicon wafer 11 was obtained.

The mask material holding thin film having a constitution of polyimide film: Al-N-O system film: polyimide film obtained in this Example was particularly good in strength and chemical resistance.

EXAMPLE 12

Except for forming polyester films with a thickness of 2 μm according to the vapor deposition method on the silicon oxide film 12 on one side of the silicon wafer 11 in place of the polyimide films 13, 15, the same steps of Example 11 were repeated.

Thus, a mask structure for lithography having a laminate of polyester films and an Al-N-O system film under the state fixed with a ring frame and a silicon wafer was obtained.

The mask material holding thin film having a constitution of polyester film: Al-N-O system film: polyester film obtained in this Example was particularly good in strength and chemical resistance.

EXAMPLE 13

Except for forming poly-p-xylylene films with a thickness of 2 μm according to the vapor deposition method on the silicon oxide film 12 on one side of the silicon wafer 11 in place of the polyimide films 13, 15, the same steps of Example 11 were repeated.

Thus, a mask structure for lithography having a laminate of poly-p-xylylene films and an Al-N-O system film under the state fixed with a ring frame and a silicon wafer was obtained.

The mask material holding thin film having a constitution of poly-p-xylylene film: Al-N-O system film: poly-p-xylylene film obtained in this Example was particularly good in strength and chemical resistance.

EXAMPLE 14

In the steps of Example 11, after formation of the polyimide films 13, 15 and the Al-N-O system film 14, a layer of a posi-type resist photoresist AZ-1370 (produced by Shipley Co.) was formed to a thickness of 1 μm by spin coating on the polyimide film 15.

Next, after the resist was printed with the use of a quartz mask by far UV-rays, a prescribed treatment was effected to obtain a resist pattern which is nega type relative to the mask.

Next, by means of an electron beam vapor deposition device, tantalum (Ta) was vapor deposited to a 0.5 μm thickness.

Next, the resist was removed with a remover, and a Ta film pattern was obtained according to the lift-off method.

Next, a tar type paint layer for protection with a thickness of 2 μm was further formed on the polyimide film 15.

Following subsequently the same steps of Example 11, a mask structure for lithography was obtained which has a mask material holding thin film comprising an Al-N-O system film and polyimide films and a Ta film pattern under the state fixed with a ring frame and a silicon wafer.

The mask material holding thin film having a constitution of polyimide film: Al-N-O system film: polyimide film obtained in this Example was particularly good in strength.

EXAMPLE 15

In the same manner as in Example 11, a laminate consisting of five layers of a polyimide film (1 μm thickness), an Al-N-O system film (1 μm thickness), a polyimide film (3 μm thickness), an Al-N-O system film (1 μm thickness) and a polyimide film (1 μm thickness) was formed on the silicon wafer.

Following subsequently the same steps of Example 11, the circular central portions of the silicon wafer and the silicon oxide film, and further the polyimide films at the exposed portions were removed with a hydrazine type solvent, followed by adhesion of a ring frame similarly as in Example 11.

Thus, a mask structure for lithography having a laminate of three layers of an Al-N-O system film (1 μm thickness), a polyimide film (3 μm thickness) and an Al-N-O system film (1 μm thickness) under the state fixed with a ring frame and silicon wafer was obtained.

The mask material holding thin film having the constitution of Al-N-O system film: polyimide film: Al-N-O system film obtained in this Example was particularly good in heat dissipation.

EXAMPLE 16

Except for forming polyester films according to the vapor deposition method in place of polyimide films, the same steps as in Example 15 were repeated.

Thus, a mask structure for lithography having a laminate of three layers of an Al-N-O system film, a polyester film and an Al-N-O system film under the state fixed with a ring frame and silicon wafer was obtained.

The mask material holding thin film having the constitution of Al-N-O system film: polyester film: Al-N-O system film obtained in this Example was particularly good in heat dissipation.

EXAMPLE 17

Except for forming poly-p-xylylene films according to the vapor deposition method in place of polyimide films, the same steps as in Example 15 were repeated.

Thus, a mask structure for lithography having a laminate of three layers of an Al-N-O system film, a poly-p-xylylene film and an Al-N-O system film under the state fixed with a ring frame and silicon wafer was obtained.

The mask material holding thin film having the constitution of Al-N-O system film: poly-p-xylylene film: Al-N-O system film obtained in this Example was particularly good in heat dissipation.

EXAMPLE 18

In Example 5, except for forming the Al-N-O system film according to the reactive sputtering method by use of an aluminum nitride (AlN) target, a gas atmosphere of argon (Ar): nitrogen ($N_2$): oxygen ($O_2$)=1:1:0.5, a gas pressure of $5 \times 10^{-3}$ Torr, a discharging power of 150 W and a film forming speed of 15 Å/min, the same steps as in Example 5 were repeated to obtain a mask structure for lithography.

EXAMPLE 19

In Example 5, except for forming the Al-N-O system film according to the reactive sputtering method by use of an aluminum oxide nitride ($7Al_3O_7:3AlN$) target, a gas atmosphere of argon (Ar):nitrogen ($N_2$)=1:1, a gas pressure of $5 \times 10^{-3}$ Torr, a discharging power of 200 W and a film forming speed of 10 Å/min., the same steps as in Example 5 were repeated to obtain a mask structure for lithography.

EXAMPLE 20

FIGS. 4(a)-(h) are schematic central sectional views showing the steps for preparation of example of the mask structure for lithography according to the present invention.

Figure 4A:
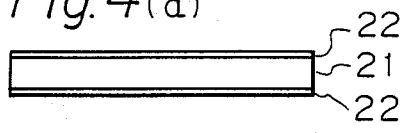

As shown in FIG. 4(a), silicon oxide layers 22 with a thickness of 1 μm were formed on both surfaces of a circular silicon wafer 21 with a diameter of 10 cm.

Figure 4E:
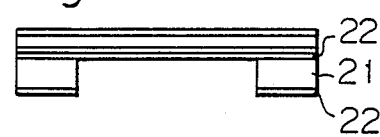
Figure 4B:
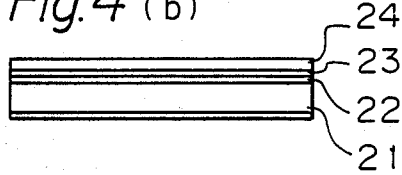

Next, as shown in FIG. 4(b), according to the plasma CVD method, on the silicon oxide film 22 on one side of the silicon wafer 21, a silicon nitride film 23 with a thickness of 0.5 μm was formed and then an Al-N-O system film 24 was formed by means of a hot electron impact type ion plating device by use of an aluminum (Al) target, a gas mixture of argon (Ar): nitrogen ($N_2$): oxygen ($O_2$)=1:3:0.1, a gas pressure of $3 \times 10^{-4}$ Torr, a discharging power of 40 W, an acceleration voltage of 600 V, a substrate temperature of 80° C. and a film forming speed of about 10 Å/sec.

Figure 4F:
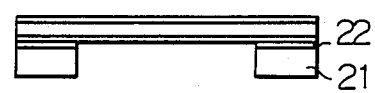
Figure 4C:
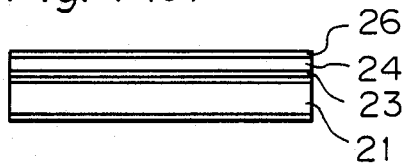

Next, as shown in FIG. 4(c), a tar type paint layer 26 for protection was formed on the Al-N-O system film 24.

Figure 4G:
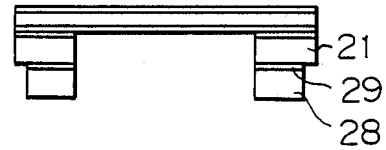
Figure 4D:
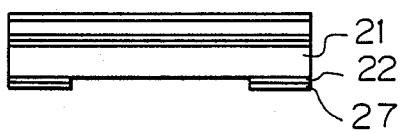

Next, as shown in FIG. 4(d), the circular central portion of the silicon oxide film 22 exposed with a diameter of 7.5 cm was removed with the use of a mixture of ammonium fluoride and hydrofluoric acid. In carrying out this treatment, for the purpose of having the silicon oxide film 22 remained in shape of a ring, a layer 27 of Apiezone wax (produced by Shell Chemical Co.) for protection was formed at that portion, and the wax layer 27 was removed after removal of the central portion of the silicon oxide layer.

Next, as shown in FIG. 4(e), electrolytic etching (current density 0.2 A/dm$^2$) was effected in an aqueous 3% hydrofluoric acid solution to remove the circular central portion of the silicon wafer 21 exposed with a diameter of 7.5 cm.

Next, as shown in FIG. 4(f), with the use of a mixture of ammonium fluoride and hydrofluoric acid, the silicon oxide film 22 at the exposed portion was removed.

Next, as shown in FIG. 4(g), onto one surface of a ring frame 28 (made of Pyrex, inner diameter 7.5 cm, outer diameter 9 cm, thickness 5 mm), an epoxy type adhesive 29 was coated, and the above silicon wafer 21 was adhered to the adhesive-coated surface on the side opposite to that on which the silicon nitride film 23 and the Al-N-O system film 24 were formed.

Figure 4H:
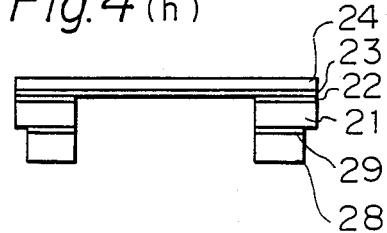

Next, as shown in FIG. 4(h), the tar type paint layer 26 was removed with acetone.

Thus, a mask structure for lithography having a laminate of a silicon nitride film 23 and an Al-N-O system film 24 under the state fixed with a ring frame 28 and a silicon wafer 21 was obtained.

The mask material holding thin film having a constitution of silicon nitride film: Al-N-O system film obtained in this Example was particularly good in light transmission.

EXAMPLE 21

After formation of a silicon oxide film with a thickness of 0.5 μm on one surface of a circular silicon wafer with a diameter of 10 cm according to the CVD method, an Al-N-O system film with a thickness of 1 μm was formed on the silicon oxide film in the same manner as in Example 20.

Next, in the same manner as in Example 20, a tar type paint layer for protection was formed on the Al-N-O system film.

Next, similarly as in Example 20, the circular central portion with a diameter of 7.5 cm of the silicon wafer was removed by electrical field etching. In carrying out this operation, in order to have the silicon wafer remained in shape of a ring, a tar type of paint layer for protection of that portion was formed and the tar paint layer was removed after removal of the central portion of the silicon wafer.

Next, a ring frame was adhered onto the surface opposite to the side on which the silicon oxide and the Al-N-O system film were formed, followed by removal of the tar type paint layer on the aluminum nitride film.

Thus, a mask structure for lithography having a laminate of a silicon oxide film and an Al-N-O system film under the state fixed with a ring frame and a silicon wafer was obtained.

The mask material holding thin film having a constitution of silicon oxide film: Al-N-O system film obtained in this Example was particularly good in light transmission.

EXAMPLE 22

In the steps of Example 20, after formation of the silicon nitride film 23 and the Al-N-O system film 24, a tar type paint layer for protection was formed on the Al-N-O system film 24.

Subsequently, according to the same procedure as in Example 20, the predetermined portion of the silicon oxide film and the circular central portion of the silicon wafer 21 were removed.

Next, the tar type paint layer was removed with acetone.

Next, a photoresist AZ-1370 (trade name, produced by Shipley Co.) was coated onto the Al-N-O system film 24.

Next, after the resist pattern was printed by reduced projection of a mask pattern with the use of a stepper, prescribed treatment was conducted to obtain a resist pattern.

Next, a tantalum (Ta) layer was formed to a thickness of 0.5 μm on the above resist pattern by vapor deposition.

Next, the resist was removed with acetone to obtain a tantalum film pattern.

Next, a ring frame was adhered in the same manner as in Example 20 to give a mask structure for lithography having a mask material holding thin film comprising a laminate of a silicon nitride film and an Al-N-O system film and a tantalum film pattern under the state fixed with a ring frame and a silicon wafer.

The mask material holding thin film having a constitution of silicon nitride film: Al-N-O system film obtained in this Example was particularly good in light transmission.

EXAMPLE 23

In the steps of Example 21, after formation of the silicon oxide film and the Al-N-O system film, a tar type paint layer for protection was formed on the Al-N-O system film 24.

Subsequently, the same steps as in Example 22 were repeated.

Thus, a mask structure for lithography having a mask material holding thin film comprising a laminate of a silicon oxide film and an Al-N-O system film and a tantalum film pattern under the state fixed with a ring frame and a silicon wafer was obtained.

The mask material holding thin film having a constitution of silicon oxide film: Al-N-O system film obtained in this Example was particularly good in light transmission.

EXAMPLE 24

FIGS. 5(a)-(h) are schematic central sectional views showing the steps for preparation of an example of the mask structure for lithography according to the present invention.

Figure 5A:
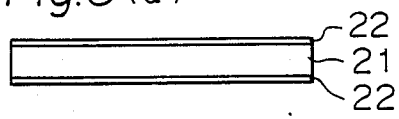

As shown in FIG. 5(a), silicon oxide layers 22 with a thickness of 1 μm were formed on both surfaces of a circular silicon wafer 21 with a diameter of 10 cm.

Figure 5E:
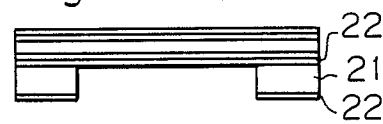
Figure 5B:
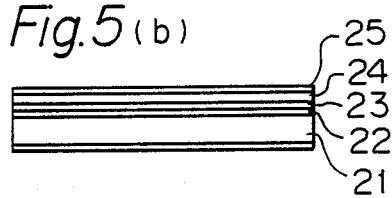

Next, as shown in FIG. 5(b), according to the plasma CVD method, on the silicon oxide film 22 on one side of the silicon wafer 21, a silicon nitride film 23 with a thickness of 0.5 μm was formed and then an Al-N-O system film 24 was formed according to the reactive sputtering method by use of an aluminum nitride (AlN) target, a gas mixture of argon (Ar):nitrogen ($N_2$):oxygen ($O_2$)=1:1:0.5, a gas pressure of $5 \times 10^{-3}$ Torr, a discharging power of 150 W and a film forming speed of about 15 Å/min, and further a silicon nitride film 25 with a thickness of 0.5 μm was formed thereon according to the plasma CVD method.

Figure 5F:
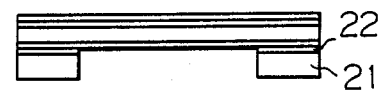
Figure 5C:
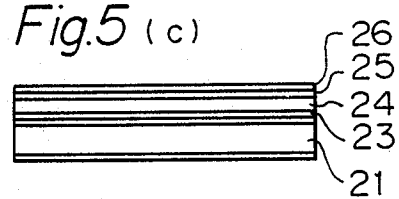

Next, as shown in FIG. 5(c), a tar type paint layer 26 for protection was formed on the silicon nitride film 25.

Figure 5G:
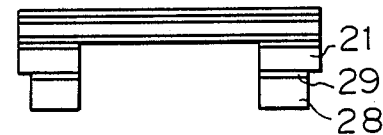
Figure 5D:
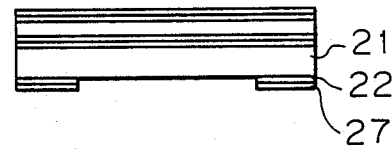

Next, as shown in FIG. 5(d), the circular central portion of the silicon oxide film 22 exposed with a diameter of 7.5 cm was removed with the use of a mixture of ammonium fluoride and hydrofluoric acid. In carrying out this treatment, for the purpose of having the silicon oxide film 22 remained in shape of a ring, a layer 27 of Apiezone wax (produced by Shell Chemical Co.) for protection was formed at that portion, and the wax layer 27 was removed after removal of the central portion of the silicon oxide layer.

Next, as shown in FIG. 5(e), electrolytic etching (current density 0.2 A/dm²) was effected in an aqueous 3% hydrofluoric acid solution to remove the circular central portion of the silicon wafer 21 exposed with a diameter of 7.5 cm.

Next, as shown in FIG. 5(f), with the use of a mixture of ammonium fluoride and hydrofluoric acid, the silicon oxide film 22 at the exposed portion was removed.

Next, as shown in FIG. 5(g), onto one surface of a ring frame 28 (made of Pyrex, inner diameter 7.5 cm, outer diameter 9 cm, thickness 5 mm), an epoxy type adhesive 29 was coated, and the above silicon wafer 21 was adhered to the adhesive-coated surface on the side opposite to that on which the silicon nitride films 23, 25 and the Al-N-O system film 24 were formed.

Figure 5H:
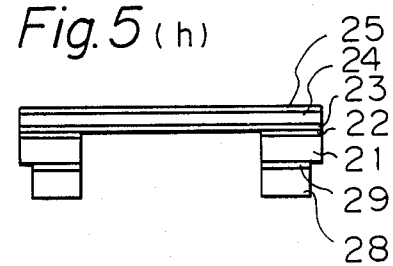

Next, as shown in FIG. 5(h), the tar type paint layer 26 was removed with acetone.

Thus, a mask structure for lithography having a laminate of silicon nitride films 23, 24 and an Al-N-O system film 24 under the state fixed with a ring frame 28 and a silicon wafer 21 was obtained.

The mask material holding thin film having a constitution of silicon nitride film: Al-N-O system film: silicon nitride film obtained in this Example was particularly good in light transmission.

EXAMPLE 25

The same steps of Example 21 were conducted, except for further forming a silicon oxide film with a thickness of 0.5 μm according to the CVD method after formation of the Al-N-O system film and forming a tar type paint layer for protection on the silicon oxide film.

Thus, a mask structure for lithography having a laminate with a constitution of silicon oxide film: Al-N-O system film: silicon oxide film under the state fixed with a ring frame 28 and a silicon wafer 21 was obtained.

The mask material holding thin film having a constitution of silicon oxide film: Al-N-O system film: silicon oxide film obtained in this Example was particularly good in light transmission.

EXAMPLE 26

The same steps of Example 20 were repeated, except for forming an Al-N-O system film with a thickness of 1 μm in the same manner as in Example 20 before formation of the silicon nitride film 23.

Thus, a mask structure of lithography having a laminate with a constitution of Al-N-O system film: silicon nitride film: Al-N-O system film under the state fixed with a ring frame and a silicon wafer was obtained.

The mask material holding thin film having a constitution of Al-N-O system film: silicon nitride film: Al-N-O system film obtained in this Example was particularly good in heat dissipation.

EXAMPLE 27

The same steps of Example 21 were conducted, except for forming an Al-N-O system film with a thickness of 1 μm in the same manner as in Example 21 before formation of the silicon oxide film 23.

Thus, a mask structure for lithography having a laminate with a constitution of Al-N-O system film: silicon oxide film: Al-N-O system film under the state fixed with a ring frame and a silicon wafer was obtained.

The mask material holding thin film having a constitution of Al-N-O system film: silicon oxide film: Al-N-O system film obtained in this Example was particularly good in heat dissipation.

EXAMPLE 28

In the steps of Example 24, after formation of the silicon nitride films 23, 25 and the Al-N-O system film 24, a tar type paint layer for protection was formed on the silicon nitride film 25.

Subsequently, similarly as in Example 24, the predetermined portion of the silicon oxide film 22 and the circular central portion of the silicon wafer 21 were removed.

Next, the tar type paint layer was removed by with acetone.

Next, a layer of a photoresist RD-200N (produced by Hitachi Kasei Co.) was formed to a thickness of 1.2 μm by spin coating on the silicon nitride film 25.

Next, after the resist was printed with the use of a quartz-chromium mask by far UV-rays, a prescribed treatment was effected to obtain a resist pattern which was neg type relative to the mask.

Next, by means of an electron beam vapor deposition device, tantalum (Ta) was vapor deposited to a 0.5 μm thickness.

Next, the resist was removed with a remover, and a Ta film pattern was obtained according to the lift-off method.

Subsequently a ring frame was adhered in the same manner as in Example 24 to give a mask structure for lithography having a mask material holding thin film comprising silicon nitride films and an Al-N-O system film and a Ta film pattern under the state fixed with a ring frame and a silicon wafer.

The mas material holding thin film having a constitution of silicon nitride film: Al-N-O system film: silicon nitride film was particularly good in light transmission.

EXAMPLE 29

After silicon oxide films were formed on both surfaces of a silicon wafer similarly as in Example 24, an Al-N-O system film was formed on its one surface in the same manner as in Example 24.

Next, a tar type paint layer for protection was formed on the Al-N-O system film.

Subsequently, in the same manner as in Example 24, the predetermined portion of the silicon oxide film 22 and the circular central portion of the silicon wafer 21 were removed.

Next, the tar type paint layer was removed with acetone.

Next, by means of a resistance heating vapor deposition machine, a chromium (Cr) film with a thickness of 300 Å was formed uniformly on the Al-N-O system film and then a gold (Au) film with a thickness of 0.5 μm uniformly thereon.

Next, a photoresist AZ-1350 was coated uniformly to a thickness of 0.5 μm onto the gold film.

Next, after the resist was printed by use of far UV-ray with a master mask placed in close contact on the resist, prescribed treatments were performed to obtain a resist pattern which was posi-type relative to the master mask.

Next, etching of the gold film was effected with the use of an iodine ($I_2$) type etchant to obtain a gold film pattern which was posi-type relative to the master mask.

Subsequently, in the same manner as in Example 24, a ring frame was adhered to give a mask structure for lithography having a mask material holding thin film comprising a laminate of an Al-N-O system film and a chromium film and a gold film pattern.

The mask material holding thin film having a constitution of Al-N-O system film: chromium film obtained in this Example was particularly good in X-ray transmission.

EXAMPLE 30

The same steps of Example 21 were conducted except for further applying PIQ liquid (polyimide precursor, produced by Hitachi Kasei Co.) on the Al-N-O system film by spin coating and thereafter curing the coating at 50° to 350° C. for 4 hours to form a polyimide film with a thickness of 2 μm.

Thus, a mask structure having a laminate with a constitution of silicon oxide film: Al-N-O system film: polyimide film under the state fixed with a ring frame and a silicon wafer was obtained.

The mask material holding thin film having a constitution of silicon oxide film: Al-N-O system film: polyimide film was particularly great in strength.

EXAMPLE 31

By repeating the procedure of Example 30, except for reversing the order of formation of the silicon oxide film and formation of the Al-N-O system film, a mask structure for lithography having a laminate with a constitution of Al-N-O system film: silicon oxide film: polyimide film.

The mask material holding thin film having a constitution of Al-N-O system film: silicon oxide film: polyimide film was particularly great in strength.

EXAMPLE 33

By repeating the procedure of Example 30, except for reversing the order of formation of the Al-N-O system film and formation of the polyimide film, a mask structure for lithography having a laminate with a constitution of silicon oxide film: polyimide film: Al-N-O system film under the state fixed with a ring frame and a silicon wafer.

The mask material holding thin film having a constitution of silicon oxide film: polyimide film: Al-N-O system film was particularly great in strength.

EXAMPLE 34

In example 20, except for forming the Al-N-O system film according to the reactive sputtering method by use of an aluminum nitride (AlN) target, a gas atmosphere of argon (Ar):nitrogen ($N_2$):oxygen ($O_2$)=1:1:0.5, a gas pressure of $5 \times 10^{-3}$ Torr, a discharging power of 150 W and a film forming speed of about 15 Å/min., the same steps as in Example 20 were repeated to obtain a mask structure for lithography.

EXAMPLE 35

In Example 20, except for forming the Al-N-O system film according to the reactive sputtering method by use of an aluminum oxide nitride ($7Al_3O_7:3AlN$) target, a gas atmosphere of argon (Ar):nitrogen ($N_2$)=1:1, a gas pressure of $5 \times 10^{-3}$ Torr, a discharging power of 200 W and a film forming speed of about 10 Å/min., the same steps as in Example 20 were repeated to obtain a mask structure for lithography.

EXAMPLE 36

In Example 20, except for practicing the step of forming an aluminum nitride film 4 with a thickness of 0.5 μm according to the reactive sputtering method by use of an aluminum (Al) target, a gas mixture of argon (Ar): nitrogen ($N_2$)=1:1, a gas pressure of $8 \times 10^{-3}$ Torr, a discharging power of 200 W in place of the step of forming the silicon nitride film, the same steps as in Example 20 were conducted to obtain a mask structure for lithography.

The mask structure for lithography having a constitution of aluminum nitride film: Al-N-O system film obtained in this Example was good in overall performances such as X-ray transmission, visible light transmission, thermal conductivity, film forming property, etc.

EXAMPLE 37

In Example 36, after the step of forming the aluminum nitride film, the step of forming a polyimide film with a thickness of 2 μm was performed by applying PIQ liquid (polyimide precursor, produced by Hitachi Kasei Co.) by spin coating and then curing the coating at 50° to 350° C. for 4 hours.

Thus, a mask structure for lithography having a constitution of polyimide film: aluminum nitride film: Al-N-O system film was obtained. The mask structure for lithography obtained in this Example was particularly good in strength and chemical resistance.

EXAMPLE 38

In Example 36, after the step of forming the aluminum nitride film, the step of forming a boron nitride film with a thickness of 0.5 μm was performed according to the reactive sputtering method.

Thus, a mask structure for lithography having a constitution of boron nitride: aluminum nitride: Al-N-O system film was obtained. The mask structure for lithography obtained in this Example was particularly good in X-ray transmission and visible light transmission.

EXAMPLE 39

FIGS. 6(a)-(f) are schematic central sectional views showing the steps for preparation of an example of the mask structure for lithography according to the present invention.

Figure 6:
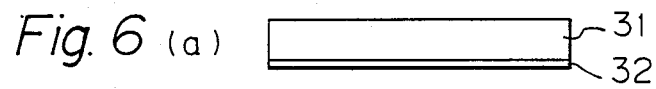
FIGS. 6(a)–(f) is a schematic central longitudinal sectional view showing the steps of an example of the process for preparing the mask structure for lithography of the present invention.
Figure 6:
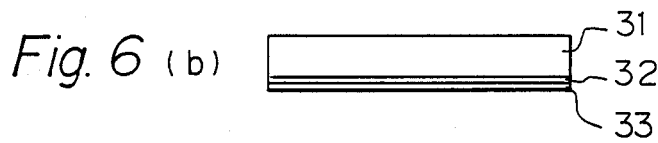
Figure 6:
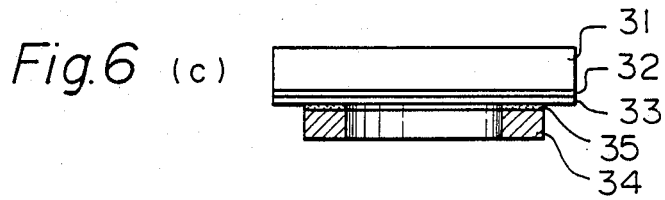
Figure 6:
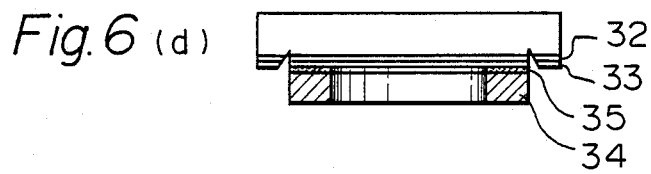
Figure 6:
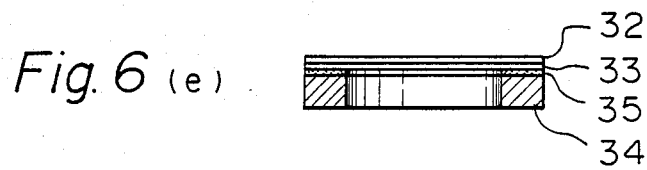
Figure 6:
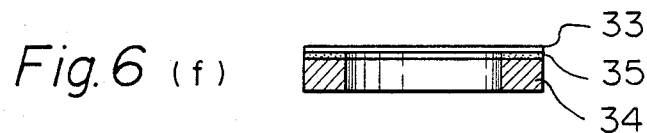

As shown in FIG. 6(a), after PI liquid (polyimide precursor, produced by Hitachi Kasei Co.) was applied by spin coating on one side of the silicon wafer 31, the coating was cured at 50° to 350° C. for 4 hours to form a polyimide film 32 with a thickness of 1.5 μm.

Next, as shown in FIG. 6(b), by means of a hot electron impact type ion plating device, an Al-N-O system film 33 with a thickness of 3 μm was formed at a film forming speed of about 10 Å/sec on the polyimide film 32 by use of an aluminum (Al) target, a gas atmosphere having a volume ratio of argon (Ar): nitrogen ($N_2$): oxygen ($O_2$)=1:3:0.1, a discharging power of 400 W, an acceleration voltage of 600 V, a gas pressure of $3 \times 10^{-4}$ Torr and a substrate temperature of 80° C.

Next, as shown in FIG. 6(c), one surface of a ring frame 34 (made of Pyrex, inner diameter 7.5 cm, outer diameter 9 cm, thickness 5 mm) was coated with an epoxy type adhesive 35 and adhered on the surface coated with the adhesive 35 with the surface of the above Al-N-O system film 33.

Next, as shown in FIG. 6(d), along the outer circumference of the ring frame 34, cuttings were formed on the Al-N-O system film 33 and the polyimide film 32.

Next, as shown in FIG. 6(e), the silicon wafer 31 was separated and removed by applying sonication in an aqueous solution containing a surfactant (sodium alkylbenzenesulfonate).

Next, as shown in FIG. 6(f), the polyimide film 32 was removed with a hydrazine type solvent. During the solvent treatment, for protection of the Al-N-O system film 33, the Al-N-O system film 33 was coated with a tar type paint, and the tar type paint layer was removed with acetone after removal of the polyimide film 32.

Thus, a mask structure for lithography comprising an Al-N-O system film 33 fixed on a ring frame 34 was obtained.

EXAMPLE 40

On the Al-N-O system film 33 of the mask structure for lithography obtained in Example 39, a gold (Au) film with a thickness of 0.5 μm was uniformly formed by means of a resistance heating vapor deposition machine.

Next, onto the gold film, a photoresist AZ-1350 (produced by Shipley Co.) was coated uniformly to a thickness of 0.5 μm.

Next, after the resist was printed by use of far UV-rays within a master mask placed in close contact on the resist, prescribed treatments were performed to give a resist pattern which was posi-type relative to the master mask.

Next, etching of the gold film was effected with the use of an iodine (I$_2$) type gold etchant to obtain a gold film pattern which was posi-type relative to the master mask.

Next, the resist was removed with a ketone type solvent.

Thus, a mask structure for lithography having an Al-N-O system film with a gold film pattern formed thereon fixed on a ring frame was obtained.

EXAMPLE 41

The same steps as in Example 39 were repeated except for not removing the polyimide film 32.

Thus, a mask structure having a laminate of a polyimide film and an Al-N-O system film fixed on a ring frame was obtained.

EXAMPLE 42

In the steps of Example 39, after formation of the Al-N-O system film 33, a gold (Au) film with a thickness of 0.5 μm was uniformly formed by means of a resistance heating vapor deposition machine.

Next, onto the gold film, a photoresist AZ-1350 (produced by Shipley Co.) was coated uniformly to a thickness of 0.5 μm.

Next, after the resist was printed by use of far UV-rays with a master mask placed in close contact on the resist, prescribed treatments were performed to give a resist pattern which was posi-type relative to the master mask.

Next, etching of the gold film was effected with the use of an iodine (I$_2$) type gold etchant to obtain a gold film pattern which was posi-type relative to the master mask.

Next, after the resist was removed with a ketone type solvent, one surface of a ring frame (made of Pyrex, inner diameter 7.5 cm, outer diameter 9 cm, thickness 5 mm) was coated with an epoxy type resin and adhered on the surface coated with the adhesive with the Al-N-O system film surface attached with the above gold film pattern in the same manner as in Example 39.

Subsequently, similarly as described in Example 39, cuttings were formed on the Al-N-O system film and the polyimide film along the outer circumference of the ring frame, subjected to sonication in an aqueous solution containing a surfactant (sodium alkylbenzenesulfonate) to thereby separate and remove the silicon wafer.

Thus, a mask structure for lithography having a laminate of a polyimide film and an Al-N-O system film with a gold film pattern formed thereon fixed on ring frame was obtained.

EXAMPLE 43

On both surfaces of a circular silicon wafer of 10 cm in diameter, silicon oxide films with a thickness of 1 μm were formed.

Next, on the silicon oxide film on one side of the silicon wafer, an Al-N-O system film was formed to a thickness of 1 μm at a film formation speed of about 15 Å/min. according to the reactive sputtering method by use of an aluminum (Al) target, a gas mixture of argon (Ar): nitrogen (N$_2$): oxygen (O$_2$)=1:1:0.5, a gas pressure of $5 \times 10^{-3}$ Torr and a discharging power of 150 W, followed by formation of a boron nitride film with a thickness of 2 μm on the Al-N-O system film according to the same sputtering method except for employing a boron nitride target.

Next, by adhering a ring frame in the same manner as in Example 39 and repeating subsequently the same steps as in Example 39, a silicon wafer attached with the silicon oxide film was separated and removed.

Thus, a mask structure for lithography comprising a laminate of an Al-N-O system film and a boron nitride film fixed on a ring frame was obtained.

EXAMPLE 44

In the steps of Example 43, except for further forming an Al-N-O system film with a thickness of 1 μm according to the reactive sputtering method after formation of the boron nitride film, the same steps of Example 43 were repeated.

Thus, a mask structure for X-ray lithography comprising a laminate having a constitution of Al-N-O system film: boron nitride film: Al-N-O system film fixed on a ring frame was obtained.

EXAMPLE 45

On both surfaces of a circular silicon wafer of 10 cm in diameter, silicon oxide films with a thickness of 1 μm were formed.

Next, on the silicon oxide film on one side of the silicon wafer, an Al-N-O system film was formed to a thickness of 1 μm according to the reactive sputtering method by use of an aluminum oxide nitride (7Al$_3$O$_7$:3AlN) target, a gas mixture of argon (Ar):nitrogen (N$_2$)=1:1, a gas pressure of $5 \times 10^{-3}$ Torr, a discharging power of 200 W and a film forming speed of about 10 Å/min.

Next, an aluminum nitride film with a thickness of 0.5 μm was formed according to the reactive sputtering method by use of an aluminum (Al) target, a gas mixture of argon (Ar): nitrogen (N$_2$)=1:1, a gas pressure of $8 \times 10^{-3}$ Torr and a discharging power of 200 W.

Next, by adhering a ring frame in the same manner as in Example 39 and performing subsequently the same steps as in Example 39, a silicon wafer attached with the silicon oxide film was separated and removed.

Thus, a mask structure for lithography comprising a laminate of an Al-N-O system film and an aluminum nitride film fixed on a ring frame was obtained.

The mask material holding thin film constituting the mask structure obtained in this Example was good in overall performances such as X-ray transmission, visible light transmission, thermal conductivity, film forming property, etc.

The mask structures for lithography of the present invention prepared according to the method for preparation of mask structure for lithography of the present invention as described above in Examples 39 to 45 have further the effects that the preparation steps are simple and rapid and that the yield is high, in addition to the effects brought about by use of Al-N-O system materials as the constituent of the mask material holding thin film.

EXAMPLE 46

FIG. 7(a) is a schematic central longitudinal sectional view showing an example of the mask structure for lithography according to the present invention, and FIG. 7(b) is a schematic plan view of a ring frame of said mask structure for lithography. In FIGS. 7(a) and (b), 42 is a mask material holding thin film and is supported at its peripheral portion on the upper end surface of the ring frame 43.

The above mask material holding thin film 42 may comprise a single layer of an Al-N-O system material or alternatively a laminate of an Al-N-O system material with other inorganic and/or organic materials.

In the mask structure for lithography of this Example, the uppermost flat end surface 43a of the ring frame 43 was coated with no adhesive for adhering the mask material holding thin film, but coated with an adhesive 44 only at the slanted plane 43b which crosses the outside of the uppermost flat end surface 43a at an angle of $\theta$. The angle $\theta$ is not particularly limited, provided that it is a value exceeding zero degree, but preferably 5 to 90 degrees, more preferably 5 to 60 degrees, optimally 5 to 30 degrees.

Also, as the above adhesive 44, for example, solvent type adhesives (butadiene type synthetic rubber adhesives, chloroprene type synthetic rubber adhesives, etc.), non-solvent type adhesives (epoxy type adhesives, cyanoacrylate type adhesives, etc.) can be used.

FIGS. 8(a)-(g) show the steps for preparation of an example of the mask structure for lithography according to the present invention as shown in FIGS. 7(a) and (b).

Figure 8A:
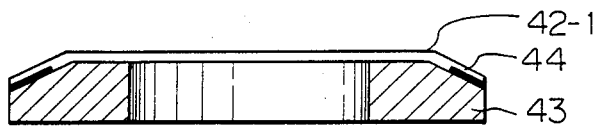
FIGS. 8(a)–(g) is a schematic central longitudinal sectional view showing the preparation steps of an example of the mask structure for lithography according to the present invention.

As shown in FIG. 8(a), the slanted portion of a ring frame 43 (made of Pyrex, inner diameter 7.5 cm, outer diameter 9 cm, thickness 5 mm; formed with a slanted surface outside of the uppermost flat end surface which crosses the flat end surface at an angle of 15 degrees) was coated with an epoxy type resin 44, and a polyimide film 42-1 (thickness 7 $\mu$m) isotropically stretched was adhered and fixed through the epoxy adhesive 44 onto the ring frame 43, and the polyimide film 42-1 coming out from the ring frame 43 was cut off.

Figure 8B:
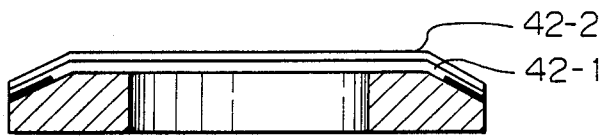

Next, as shown in FIG. 8(b), an Al-N-O system film 42-2 was formed to a thickness of 3 $\mu$m by means of a hot electron impact type ion plating device by use of an aluminum (Al) target, a gas mixture of argon (Ar): nitrogen ($N_2$): oxygen ($O_2$)=1:3:0.1, a gas pressure of $3 \times 10^{-4}$ Torr and a discharging power of 400 W and a film forming speed of about 10 Å/sec.

Figure 8C:
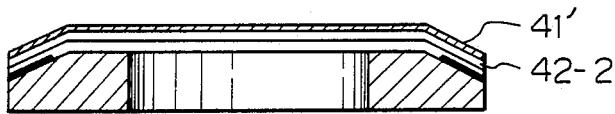

Next, as shown in FIG. 8(c), on the Al-N-O system film 42-2, a gold (Au) film with a thickness of 0.5 $\mu$m 41' was uniformly formed by means of a resistance heating vapor deposition machine.

Figure 8D:
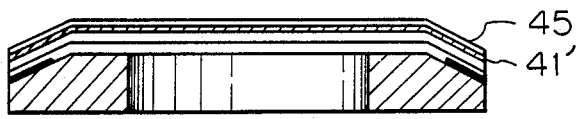

Next, as shown in FIG. 8(d), onto the gold film 41', a photoresist AZ-1350 (produced by Shipley Co.) 45 was coated uniformly to a thickness of 0.5 $\mu$m.

Figure 8E:
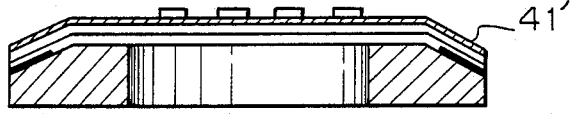

Next, as shown in FIG. 8(e), after the resist was printed by use of far UV-rays with a master mask placed in close contact on the resist, prescribed treatments were performed to give a resist pattern which was posi-type relative to the master mask.

Figure 8F:
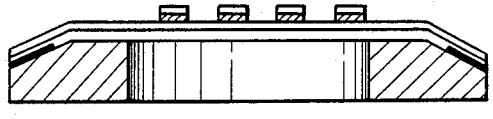

Next, as shown in FIG. 8(f), etching of the gold film 41' was effected with the use of an iodine ($I_2$) type gold etchant to obtain a gold film pattern which was posi-type relative to the master mask.

Figure 8G:
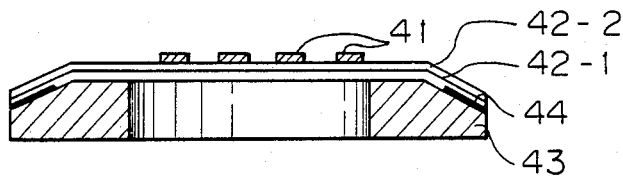

Next, the resist was removed with a ketone type solvent to form a mask pattern 41 comprising a gold film, thus providing, as shown in FIG. 8(g), a mask structure for lithography having a laminate of a polyimide film 42-1 and an Al-N-O system film 42-2 as the mask material holding thin film with a mask pattern 41 formed on the mask material holding thin film.

EXAMPLE 47

In the steps of Example 46, except for further removing the exposed portion of the polyimide film 42-1 in an oxygen plasma according to the reactive ion etching method after formation of the Al-N-O system film 42-2 and then forming the gold film 41' on the Al-N-O system film 42-2, the same steps as in Example 46 were repeated.

Thus, a mask structure for lithography comprising the Al-N-O system film as the mask material holding thin film and having a mask pattern formed on the mask material holding thin film was obtained.

EXAMPLE 48

In Example 46, after the polyimide film coming out from the ring frame was cut off, an Al-N-O system film with a thickness of 1 $\mu$m was formed according to the reactive sputtering method on the polyimide film by use of an aluminum (Al) target, a gas mixture of argon (Ar): nitrogen ($N_2$): oxygen ($O_2$)=1:1:0.5, a gas pressure of $5 \times 10^{-3}$ Torr, a discharging power of 150 W and a film forming speed of about 15 Å/min.

Next, a boron nitride film with a thickness of 2 $\mu$m was formed on the Al-N-O system film according to the same sputtering method except for using a boron nitride film.

Next, a gold film pattern was formed in the same manner as in Example 46 to obtain a mask structure for lithography comprising a laminate of the polyimide film, the Al-N-O system film and the boron nitride film as the mask material holding thin film.

EXAMPLE 49

In Example 46, after the polyimide film coming out from the mask frame was cut off, on the polyimide film was formed an Al-N-O system film to a thickness of 1 $\mu$m according to the reactive sputtering method by use of an aluminum oxide nitride ($7Al_3O_7:3AlN$) target, a gas mixture of argon (Ar):nitrogen ($N_2$)=1:1, a gas pressure of $5 \times 10^{-3}$ Torr, a discharging power of 200 W and a film forming speed of about 10 Å/min.

Next, an aluminum nitride film with a thickness of 0.5 $\mu$m was formed according to the reactive sputtering method by use of an aluminum (Al) target, a gas mixture of argon (Ar): nitrogen ($N_2$)=1:1, a gas pressure of $8 \times 10^{-3}$ Torr and a discharging power of 200 W.

Next, the same steps as in Example 46 were conducted except for removing the exposed portion of the polyimide film according to the reactive ion etching method in an oxygen plasma and then forming a gold film pattern on the aluminum nitride film.

Thus, a mask structure for lithography comprising a laminate of an Al-N-O system film and an aluminum nitride film as the mask material holding thin film and having a mask pattern formed on the mask material holding thin film was obtained.

The mask material holding thin film constituting the mask structure obtained in this Example was particularly good in overall performances such as X-ray transmission, visible light transmission, thermal conductivity, film forming property, etc.

EXAMPLE 50

FIG. 9 is a schematic central longitudinal sectional view showing an example of the mask structure for lithography according to the present invention.

Onto the Al-N-O system film 42-2 on the upper slanted plane 43b of the ring frame 43 of the mask structure for lithography obtained in Example 48, a press ring 50 was further adhered through an adhesive 49 as shown in FIG. 9. The adhered interface between the press ring 50 and the Al-N-O system film 42-2 is formed in parallel to the upper slanted plane 43b of the ring frame 43.

In the mask structure for lithography of this Example, by supporting with application of a pressure between the ring frame 43 and the press ring 50, the mask material holding this film can be supported more firmly on the ring frame 43.

In the above Examples, there is formed outside of the uppermost flat end surface 43a of the ring frame 43 a slanted plane 43b crossing at a certain angle the uppermost flat end surface 43a, and adhesion is effected at the slanted plane 43b, but the embodiments of the mask structure for lithography of the present invention are not limited thereto.

Figure 10A:
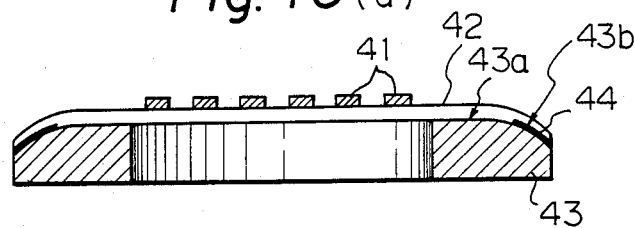
FIG. 10(a) is a schematic central longitudinal sectional view showing an example of the mask structure for lithography according to the present invention.
Figure 10B:
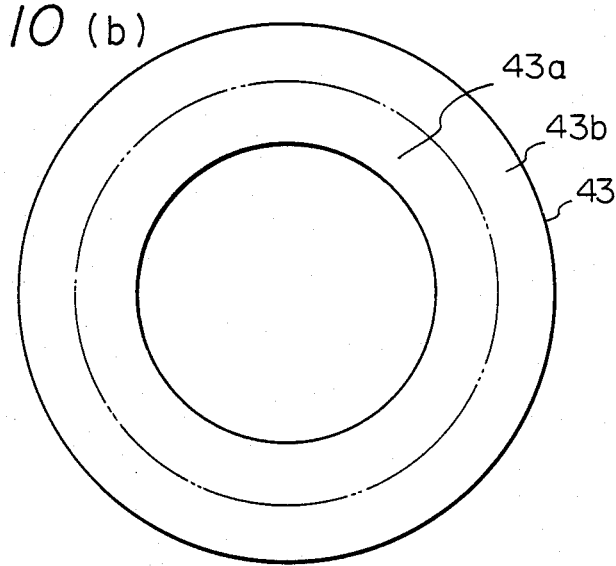
FIG. 10(b) is a schematic plan view of the ring frame of the mask structure for lithography.

FIG. 10(a) is a schematic central longitudinal sectional view showing an example of the mask structure for lithography according to the present invention for illustration of another shape of the ring frame 43, and FIG. 10(b) is a schematic plan view of the ring frame 43. Here, there is formed a slanted plane 43b outside the uppermost flat end surface 43a of the ring frame 43, which is connected smoothly to the uppermost flat end surface 43a, and adhesion is effected at the slanted surface 43b.

Figure 11:
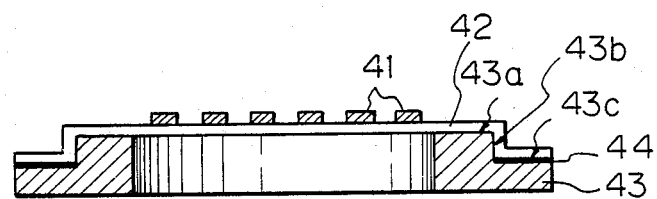
FIG. 11 is a schematic central longitudinal sectional view showing an example of the mask structure for lithography according to the present invention.

FIG. 11 is a schematic central longitudinal sectional view showing an example of the mask structure for lithography according to the present invention for illustration of still another shape of the ring frame 43. Here, there is formed outside of the uppermost flat end surface 43a a plane 43b crossing at right angle the uppermost flat and surface 43a, a plane 43c is formed further outside of the plane 43b at a position lower than that of the uppermost flat end surface 43a, and adhesion is effected at the plane 43c.

The mask structures for lithography as described in the above Examples 46–50, in addition to the effects brought about by use of Al-N-O system films as constituent of the mask material holding thin film, can further improve flatness of the mask material holding thin film, thereby having the effect of practicing more improved lithography.

According to the present invention as described above, the Al-N-O system substance used as the constituting element of the mask material holding thin film has specific features of high X-ray transmittance and visible light transmittance (about 0.1 of optical density through 1 μm thickness), low coefficient of thermal expansion ($3-4 \times 10^{-6}$/°C.), high coefficient of thermal conductivity and good film forming property, and therefore the following effects can be obtained.

(1) Preparation of a mask material holding thin film can be easily and excellently done, because high X-ray transmittance through the Al-N-O system substance can afford a relatively high amount of X-rays, transmitted even when the film thickness is made relatively thicker.

(2) Good film forming property of the Al-N-O system substance enables preparation of a mask material holding thin film consisting of a very thin film, whereby the amount of X-rays transmitted can be enhanced to improve throughput of printing in lithography.

(3) High transmittance of visible light through the Al-N-O system substance enables easy and accurate alignment by observation with eyes by use of visible light in lithography.

(4) Since the coefficient of thermal expansion of the Al-N-O system substance is approximately the same value as that of the silicon wafer printing substrate ($2-3 \times 10^{-6}$/°C.) in lithography, printing of very high precision is rendered possible.

(5) High thermal conductivity of the Al-N-O system substance can prevent temperature elevation by X-ray irradiation, which effect being particularly great during printing in vacuum.

(6) In the case of using a laminate of a layer of the Al-N-O system substance and a layer of an organic material as the mask material holding thin film, a mask material holding thin film having the characteristics of the organic material in addition to the characteristics of the Al-N-O system substance as described above can be obtained. That is, such a mask material holding thin film, in addition to the effect possessed by the mask material holding thin film consisting of a single layer of the Al-N-O system substance, has also the effects of greater strength and substantial absence of stress.

(7) In the case of using a laminate of a layer of the Al-N-O system substance and a layer of an inorganic material different from the above substance as the mask material holding thin film, a mask material holding thin film having the characteristics of the inorganic material in addition to the characteristics of the above substance as described above can be obtained. That is, such a mask material holding thin film has also excellent light transmittance and thermal conductivity as well as relatively great strength and chemical resistance. Also, when a layer of an organic material is further laminated, the specific features such as greater strength and substantial absence of stress are added.

(8) Since the Al-N-O system film has the characteristics of very excellent chemical stability, weather resistance and shelf life in addition to the characteristics also possessed by aluminum nitride such as high X-ray transmittance and visible light transmittance, low coefficient of thermal expansion, high coefficient of thermal conductivity and good film forming property, it is more preferred than aluminum nitride as a mask material holding thin film of the mask structure for lithography.

What is claimed is:

1. A mask structure for lithography having a mask material holding thin film and a holding substrate for holding the peripheral portion of said mask material holding thin film, said mask material holding thin film comprising aluminum nitride oxide.

2. A mask structure according to claim 1, wherein said mask material holding thin film further has a layer of an organic material.

3. A mask structure according to claim 2, wherein said organic material is a polyimide.

4. A mask structure according to claim 2, wherein said organic material is a polyamide.

5. A mask structure according to claim 2, wherein said organic material is a polyester.

6. A mask structure according to claim 2, wherein said organic material is a poly-p-xylylene.

7. A mask structure according to claim 1, wherein said mask material holding thin film has further a layer of an inorganic material different from the substance containing aluminum nitride oxide.

8. A mask structure according to claim 7, wherein said inorganic material is boron nitride.

9. A mask structure according to claim 7, wherein said inorganic material is silicon nitride.

10. A mask structure according to claim 7, wherein said inorganic material is silicon oxide.

11. A mask structure according to claim 7, wherein said inorganic material is silicon carbide.

12. A mask structure according to claim 7, wherein said inorganic material is titanium.

13. A mask structure according to claim 1, wherein said mask material holding thin film has further a layer of an organic material and a layer of an inorganic material different from the substance containing aluminum, nitride oxide.

14. A mask structure according to claim 13, wherein said organic material is a polyimide.

15. A mask structure according to claim 13, wherein said organic material is a polyamide.

16. A mask structure according to claim 13, wherein said organic material is a polyester.

17. A mask structure according to claim 13, wherein said organic material is a poly-p-xylylene.

18. A mask structure according to claim 13, wherein said inorganic material is boron nitride.

19. A mask structure according to claim 13, wherein said inorganic material is silicon nitride.

20. A mask structure according to claim 13, wherein said inorganic material is silicon oxide.

21. A mask structure according to claim 13, wherein said inorganic material is silicon carbide.

22. A mask structure according to claim 13, wherein said inorganic material is titanium.

23. A mask structure according to claim 1, wherein the material of said holding substrate is selected from silicon, glass, quartz, phosphor bronze, brass, nickel and stainless steel.

24. A mask structure according to claim 1, wherein said holding substrate has an uppermost flat end plane and wherein said mask material holding thin film is adhered to said holding substrate at a position lower than the uppermost flat end plane of said substrate.

25. A mask structure according to claim 1, further having a mask material imparted in the form of a thin film to said mask material holding thin film.

26. A mask structure according to claim 25, wherein said mask material is selected from gold, platinum, nickel, palladium, rhodium, indium, tungsten, tantalum and copper.

27. A mask structure according to claim 25, wherein said mask material is has a pattern.

28. A lithographic method, which comprises using a mask structure for lithography as defined in claim 1.

29. A process for preparing a mask structure for lithography comprising the steps of:
forming a mask material holding thin film including a film comprising aluminum nitride oxide on a first substrate;
adhering a ring-shaped holding substrate to said material holding thin film; and
removing at least a portion of said first substrate from said mask material holding thin film.

30. A process according to claim 29, further comprising the step of imparting a mask material in the form of a thin film to said mask material holding thin film.

31. A process according to claim 30, further comprising the step of forming a pattern in said mask material.

32. A process according to claim 29, wherein the step of removing said first substrate from said mask material holding thin film is carried out by permitting ultrasonic waves to act thereon in a solvent.

33. A process for preparing a mask structure for lithography comprising the steps of:
forming on a holding substrate a mask material holding thin film comprising aluminum nitride oxide; and
removing a central portion of said holding substrate.

34. A process according to claim 33, further comprising the step of imparting a mask material in the form of a thin film to said mask material holding thin film.

35. A process according to claim 34, further comprising the step of forming a pattern in said mask material.

36. A process according to claim 33, wherein the removing step is followed by the step of adhering a ring frame to a peripheral portion of said holding substrate.

* * * * *

UNITED STATES PATENT AND TRADEMARK OFFICE
CERTIFICATE OF CORRECTION

PATENT NO. : 4,837,123

DATED : June 6, 1989

INVENTOR(S) : Hideo Kato, et al.

It is certified that error appears in the above-identified patent and that said Letters Patent is hereby corrected as shown below:

COLUMN 1

Line 29, "the" should be deleted.
    Line 36, "X-rays" should read --X-ray--.
    Line 37, "UV-ray," should read --UV-rays,--.
    Line 42, "absorbs" should read --absorb--.

COLUMN 3

Line 19, "mask," should read --mask--.

COLUMN 5

Line 13, "lithography" should read --lithography,--.

COLUMN 6

Line 3, "remained in shape" should read --remain in he shape--.

COLUMN 9

Line 39, "power of 50W," should read --power of 50W,--.
    Line 49, "remained in shape" should read --remain in he shape--.

UNITED STATES PATENT AND TRADEMARK OFFICE
CERTIFICATE OF CORRECTION

PATENT NO. : 4,837,123

DATED : June 6, 1989

INVENTOR(S) : Hideo Kato, et al.

It is certified that error appears in the above-identified patent and that said Letters Patent is hereby corrected as shown below:

COLUMN 12

Line 6, "of example" should read --of an example--.
    Line 31, "remained in shape" should read --remain in the shape--.

COLUMN 15

Line 50, "by" should be deleted.
    Line 58, "neg type" should read --nega type--.

COLUMN 16

Line 3, "mas" should read --mask--.

COLUMN 18

Line 19, "PI liquid" should read --PIQ liquid--.

COLUMN 19

Line 53, "on ring" should read --on a ring--.

COLUMN 23

Line 32, "and surface" should read --end surface--.

UNITED STATES PATENT AND TRADEMARK OFFICE
CERTIFICATE OF CORRECTION

PATENT NO. : 4,837,123

DATED : June 6, 1989

INVENTOR(S) : Hideo Kato, et al.

It is certified that error appears in the above-identified patent and that said Letters Patent is hereby corrected as shown below:

COLUMN 25

Line 6, "aluminum," should read --aluminum--.

COLUMN 26

Line 4, "is" should be deleted.
Line 28, "film comprising" should read --film including a film comprising--.

Signed and Sealed this

Fifth Day of March, 1991

Attest:

HARRY F. MANBECK, JR.

*Attesting Officer*  *Commissioner of Patents and Trademarks*